(12) United States Patent
Petry et al.

(10) Patent No.: US 8,987,639 B2
(45) Date of Patent: Mar. 24, 2015

(54) ELECTROSTATIC CHUCK WITH RADIATIVE HEATING

(75) Inventors: Klaus Petry, Merrimac, MA (US); James Carroll, Amesbury, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 246 days.

(21) Appl. No.: 13/603,881

(22) Filed: Sep. 5, 2012

(65) Prior Publication Data

US 2014/0061180 A1    Mar. 6, 2014

(51) Int. Cl.
| | |
|---|---|
| *H05B 11/00* | (2006.01) |
| *H05B 3/68* | (2006.01) |
| *H01L 21/67* | (2006.01) |
| *H01L 21/683* | (2006.01) |
| *H01L 21/687* | (2006.01) |
| *H05B 3/00* | (2006.01) |

(52) U.S. Cl.
CPC ........ *H05B 3/0047* (2013.01); *H01L 21/67115* (2013.01); *H01L 21/6831* (2013.01); *H01L 21/68757* (2013.01)
USPC ........................................ 219/201; 219/444.1

(58) Field of Classification Search
CPC ................. H01L 21/67103; H01L 21/67109; H01L 21/67248; H01L 21/6831; H05B 3/12–3/283; H05B 3/0047; H02N 13/00
USPC ............. 219/201, 443.1–468.2; 392/418–422
See application file for complete search history.

(56) References Cited

U.S. PATENT DOCUMENTS

| | | | | |
|---|---|---|---|---|
| 4,766,515 | A * | 8/1988 | Bollen et al. ................. | 361/234 |
| 5,737,178 | A * | 4/1998 | Herchen ...................... | 361/234 |
| 6,121,579 | A * | 9/2000 | Aoki et al. ................... | 219/390 |
| 8,295,691 | B2 * | 10/2012 | Kusuda ........................ | 392/418 |
| 2006/0291834 | A1 * | 12/2006 | Hauf et al. ................... | 392/416 |

* cited by examiner

*Primary Examiner* — Sang Y Paik

(57) ABSTRACT

An electrostatic chuck is formed using materials that are optically transparent to a range of frequencies, such as infrared radiation. The invention discloses several methods for achieving optical transparency. The chuck electrode can be formed having a mesh pattern designed with a specific open area percentage to provide adequate wafer clamping force while still allowing sufficient levels of infrared radiation to pass through. Alternatively, the chuck electrode can also be made from a transparent conductive film. A workpiece is disposed on one surface of the chuck, and a radiative heat source is positioned on the opposite side of the chuck. A reflector plate may be used to reflect the infrared radiation toward the chuck and the wafer. The spacing of the radiation sources and the shape of the reflector plate may be modified to focus more radiation on a particular portion of the workpiece if desired.

16 Claims, 6 Drawing Sheets

US 8,987,639 B2

ELECTROSTATIC CHUCK WITH RADIATIVE HEATING

BACKGROUND OF THE INVENTION

Ion implanters are commonly used in the production of semiconductor wafers. An ion source is used to create an ion beam, which is then directed toward the wafer. As the ions strike the wafer, they dope a particular region of the wafer. The configuration of doped regions defines their functionality, and through the use of conductive interconnects, these wafers can be transformed into complex circuits.

As a wafer is being implanted, it is typically clamped to a chuck. This clamping may be mechanical or electrostatic in nature.

This chuck traditionally consists of a plurality of layers. The top layer, also referred to as the dielectric layer, contacts the wafer, and is made of an electrically insulating or semiconducting material, such as alumina, since it must produce the electrostatic field without creating a short circuit. Methods of creating this electrostatic field are known to those skilled in the art and will not be described herein. For those embodiments using coulombic force, the resistivity of the top layer, which is typically formed using crystalline and amorphous dielectric materials, is typically greater than $10^{14}$ Ω-cm. For those embodiments utilizing Johnsen-Rahbeck force, the volume resistivity of the top layer, which is formed from a semiconducting material, is typically in the range of $10^{10}$ to $10^{12}$ Ω-cm. The term "non-conductive" will be used to describe materials in either of these ranges, and suitable for creating either type of force. The coulombic force can be generated by an alternating voltage (AC) or by a constant voltage (DC) supply.

A second layer, also referred to as the base, may be made from an insulating material. To create the required electrostatic force, a plurality of electrodes may be disposed between the dielectric layer and the insulating layer. In another embodiment, the plurality of electrodes may be embedded in the insulating layer. The plurality of electrodes is constructed from an electrically conductive material, such as metal.

FIG. 1 shows a top view of a chuck, specifically showing the plurality of electrodes 100a-f of the chuck 10. As shown, each of the electrodes 100a-f is electrically isolated from the others. These electrodes 100a-f may be configured such that opposite electrodes have opposite voltages. For example, electrode 100a may have a positive voltage while electrode 100d may have a negative voltage. These voltages typically vary with time to maintain the electrostatic force. For example, as shown in FIG. 1, the voltage applied to each electrode 100a-f may be a square wave. In the embodiment shown in FIG. 1, three pairs of electrodes are employed. Each pair of electrodes is in electrical communication with a respective power source 110a-c, such that one electrode receives the positive output and the other electrode receives the negative output. Each power source 110a-c generates the same square wave output, in terms of period and amplitude. However, each square wave is phase shifted from those adjacent to it. Thus, as shown in FIG. 1, electrode 100a is powered by square wave A, while electrode 100b is powered by square wave B, which has a phase shift of 120° relative to square wave A. Similarly, square wave C is phase shifted 120° from square wave B. These square waves are shown graphically on the power supplies 110a-c of FIG. 1. Of course, other numbers of electrodes may be used.

The voltages applied to the electrodes 100a-f serves to create an electrostatic force, which clamps the workpiece to the chuck.

Ion implantation involves the collision of energetic ions with atoms in the workpiece, which may result in crystal defects and amorphization. This crystalline damage can be restored by thermal processing, known as annealing. However, for certain high dose implants and device structures, typical post-implant annealing may not be sufficient to restore all the damage caused by the implantation. Heating the workpiece during the implant process is known to reduce damage to the workpiece and to preserve more of the crystalline structure to facilitate regrowth during the anneal process.

Workpieces are typically heated by contact, such as through the use of a gas trapped between the workpiece and the chuck, such as when the workpiece is held in place through electrostatic forces. The workpiece may also be directly heated by the chuck. In both embodiments, heat is applied to the lower surface of the workpiece.

These methods may suffer from drawbacks, such as the inability to accurately heat the workpiece, or the ability to quickly and precisely adjust the temperature of the workpiece. For example, in many embodiments, the heat is applied uniformly to the workpiece. However, the ion implantation being performed on the upper surface of the workpiece may impart heat to the workpiece in a non-uniform manner. For example, the ion implantation may heat the center of the workpiece more than the edges. In this case, the added heat applied to the lower surface of the workpiece cannot compensate for this non-uniformity and therefore, the workpiece cannot be held at a uniform temperature. Furthermore, some heating methods rely on the chuck to supply the heat to the workpiece. As the chuck has a thermal mass, which may be significant, rapid changes in applied heat cannot be achieved. Therefore, a system and method of better heating a workpiece would be beneficial.

SUMMARY OF THE INVENTION

The problems of the prior art are overcome by the present disclosure. An electrostatic chuck is formed using materials that are optically transparent to a range of frequencies, such as infrared radiation. The invention discloses several methods for achieving optical transparency. The electrode can be formed having a mesh pattern designed with a specific open area percentage to provide adequate wafer clamping force while still allowing sufficient levels of infrared radiation to pass through. Alternatively, the electrode can also be made from a transparent conductive film. A workpiece is disposed on a first surface of the chuck, and a radiative heat source is positioned proximate the second surface of the chuck, opposite the first surface. A reflector plate may be used to reflect the infrared radiation toward the chuck and the wafer. The spacing of the radiation sources and the shape of the reflector plate may be modified to focus more radiation on a particular portion of the workpiece if desired.

One embodiment includes a system for holding and heating a workpiece, comprising an electrostatic chuck, having a first surface for supporting said workpiece clamped to said first surface and a second surface opposite said first surface; and one or more radiative heat sources proximate said second surface of said electrostatic chuck, emitting radiative heat within a predetermined frequency range, wherein said electrostatic chuck is comprised of a material that is optically transparent to at least a portion of said predetermined frequency range.

A second embodiment includes an electrostatic chuck, comprising an insulating layer comprising channels in its top surface; an electrically conductive material disposed in said channels, said electrically conductive material forming a mesh electrode; and a dielectric layer deposited on said insulating layer, wherein said insulating layer and said dielectric layer are optically transparent to a predetermined frequency range.

BRIEF DESCRIPTION OF FIGURES

For a better understanding of the present disclosure, reference is made to the accompanying drawings, which are incorporated herein by reference and in which.

DETAILED DESCRIPTION OF THE INVENTION

As described above, electrostatic chucks (ESCs) typically include several parts including a dielectric top layer, an insulating layer and a plurality of electrodes disposed between these layers or embedded in one of the layers.

Figure 1:
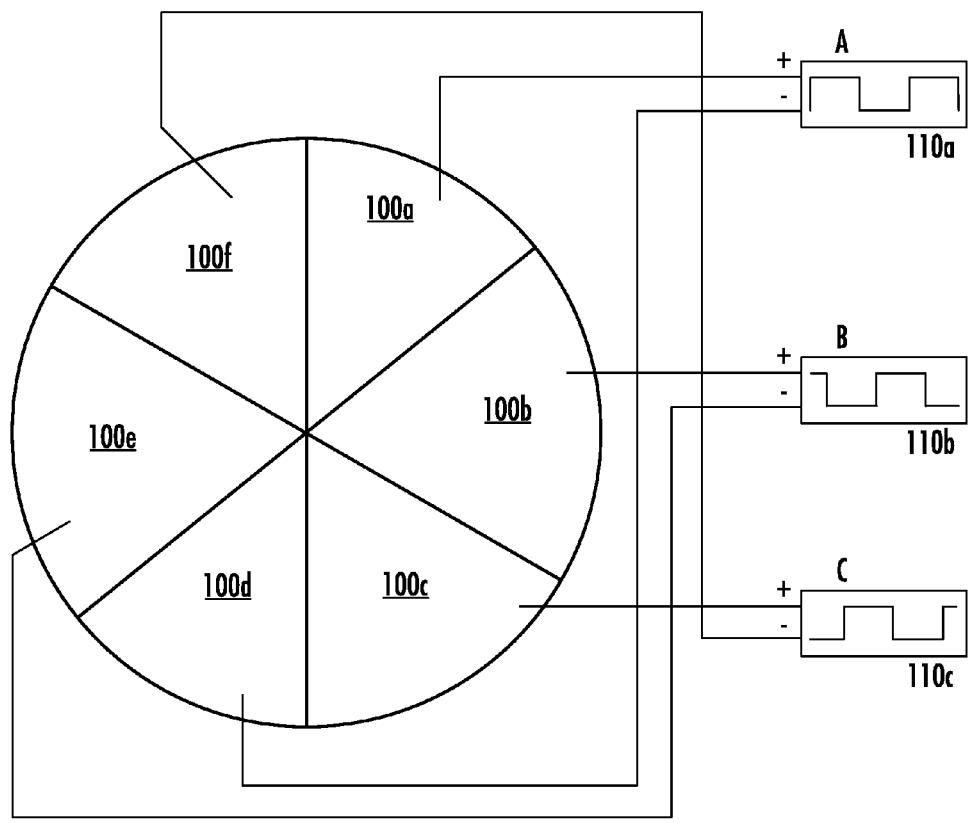
FIG. 1 represents an electrostatic chuck of the prior art.
Figure 2:
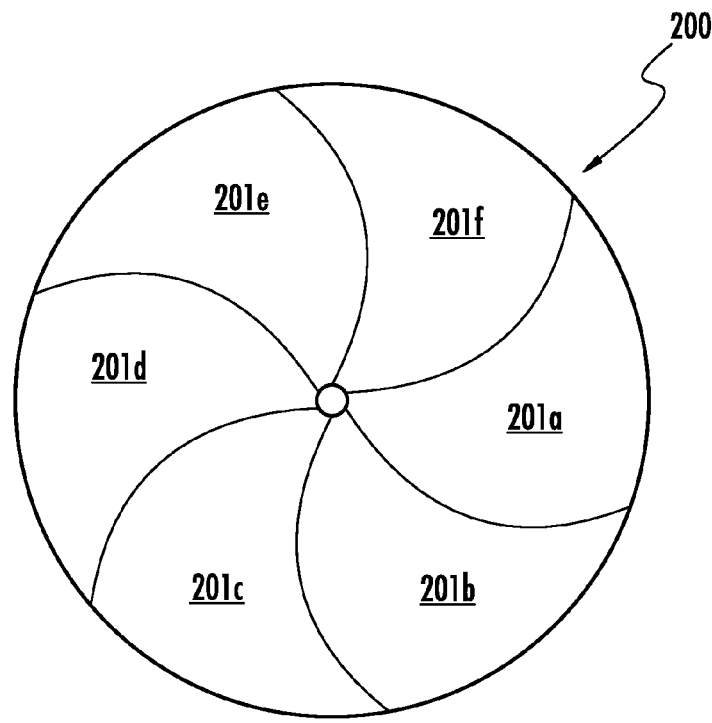
FIG. 2 represents a top view of the regions of the chuck in accordance with one embodiment.

These electrodes may be a separate layer between the dielectric layer and the insulating layer, or may be embedded in one of these layers. A top view of one embodiment of the chuck 200 is shown in FIG. 2. In this embodiment, the chuck comprises six equally sized regions 201a-f. Of course, a different number of regions may also be used. These regions may be shaped as shown in FIG. 2, or may be any other suitable shape, such as sectors. An electrode is disposed within each region 201a-f. In one embodiment, shown in FIG. 3, each electrode 420 is made up of a pattern of electrically conductive material that is embedded in the dielectric layer or insulating layer of the chuck 200. In some embodiments, this pattern may be a mesh. In some embodiments, the pattern comprises axial components 210, which consist of electrically conductive material that travels from the center 215 of the chuck 200 toward the outer edge (although not necessary in a linear fashion) and radial components 220, which traverse the axial components and may form concentric arcs. Of course, the radial components 220 are not necessary concentric. In some embodiments, the radial components may be linear or another shape, rather than arcs.

Figure 3:
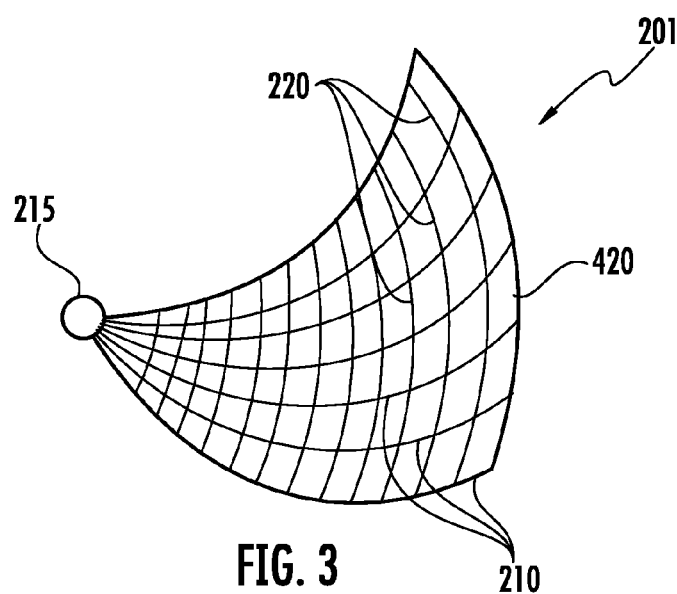
FIG. 3 represents the electrically conductive pattern within one of the regions of FIG. 2.
Figure 4:
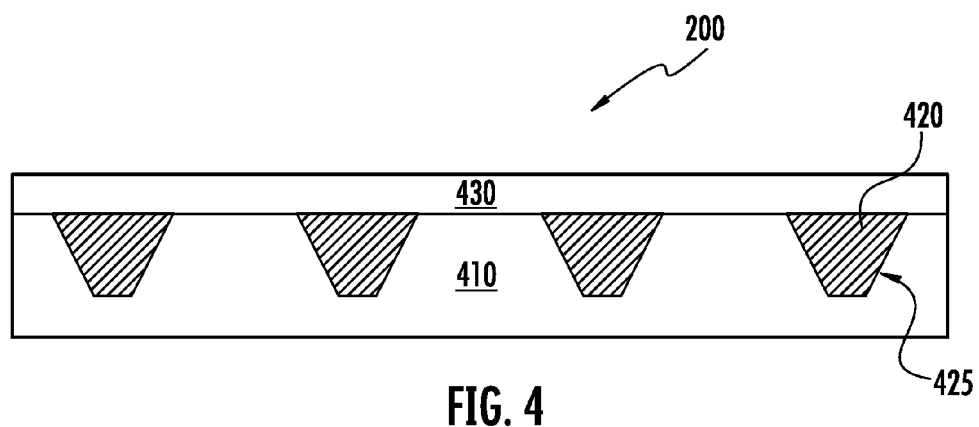
FIG. 4 shows a chuck that can be used according to one embodiment.

FIG. 4 shows a cross-sectional view of the chuck 200 according to one embodiment. This chuck 200 includes a top dielectric layer 430, an insulating layer 410 and the electrode 420 embedded in the insulating layer 420. The electrode 420 may be a mesh, as shown in FIG. 3. In this embodiment, the dielectric layer 430 and the insulating layer 410 of the chuck 200 are constructed of optically transparent materials. For example, the dielectric layer 430 and the insulating layer 410 may be constructed of quartz, glass, sapphire or other suitable materials. It is noted that different materials may be used for the different layers 410, 430.

In one embodiment, the insulating layer 410 of the chuck 200 is made of quartz, although other optically transparent materials may be used. In one embodiment, the chuck 200 may be constructed as follows. First, a photo resist pattern is applied to the top surface of the insulating layer 410. This photoresist pattern is used to selectively expose portions of the top surface of the insulating layer 410. These exposed portions represent the pattern to be used for the electrodes 420. In one embodiment, the photoresist pattern is used to create an exposed portion of the top surface of the insulating layer 410 that reflects mesh pattern shown in FIG. 3. Anisotropic or isotropic etching is used to remove material from the exposed portion of the top surface of the insulating layer 410 so as to create channels 425 in the top surface. An electrically conductive material, such as a metal, may then be deposited to the entirety of the top surface, covering the top surface and filling the channels 425. The electrically conductive material in the channels 425 forms the electrodes 420.

In other embodiments, the electrically conductive material may be a doped semiconductor or graphene that is optically transparent. For example, the electrically conductive material may be a transparent conductive oxide (TCO) film, such as aluminum doped zinc oxide or tin-doped indium-oxide.

The top surface of the insulating layer 410 is then lapped so as to remove a thin layer of material, and leave the top surface of the insulating layer 410 smooth. This lapping operation serves to remove the electrically conductive material from the top surface, but electrically conductive material remains in the channels 425. As stated above, these channels 425 may be formed in a specific pattern, such as the mesh pattern shown in FIG. 3. These channels filled with electrically conductive material form mesh electrodes.

The width of these channels 425 may vary and may be selected based on the electrical current requirements and other factors. The spacing between the channels 425 permits optical transparency of the conductive pattern. Thus, to maximize the amount of radiative heat that passes through the chuck 200, the channels 425 should occupy a small percentage of the entire area of the top surface of the insulating layer 410. In some embodiments, the ratio of the transparent spacing area to the total area of the conductive region is greater than about 80%. Stated differently, the channels 425, which are not transparent, occupy less than about 20% of the total area of the top surface of the insulating layer 410.

A top dielectric layer 430 is then applied on top of the top surface of the insulating layer 410. This dielectric layer 430 is made of a dielectric material. This may be deposited glass or spun on glass. In other embodiments, a layer of quartz or another type of optically transparent dielectric may be adhered to the insulating layer 410.

A completed chuck 200 comprises an insulating layer 410 where the channels 425, filled with electrically conductive material, form the electrodes 420. A top dielectric layer 430 is applied over the insulating layer 410, thereby isolating the electrodes 420 from the workpiece. The workpiece is then applied to the top surface of the dielectric layer 430. An electrostatic field is created by applying a voltage to the electrodes 420, as is known in the art and explained above.

Figure 5:
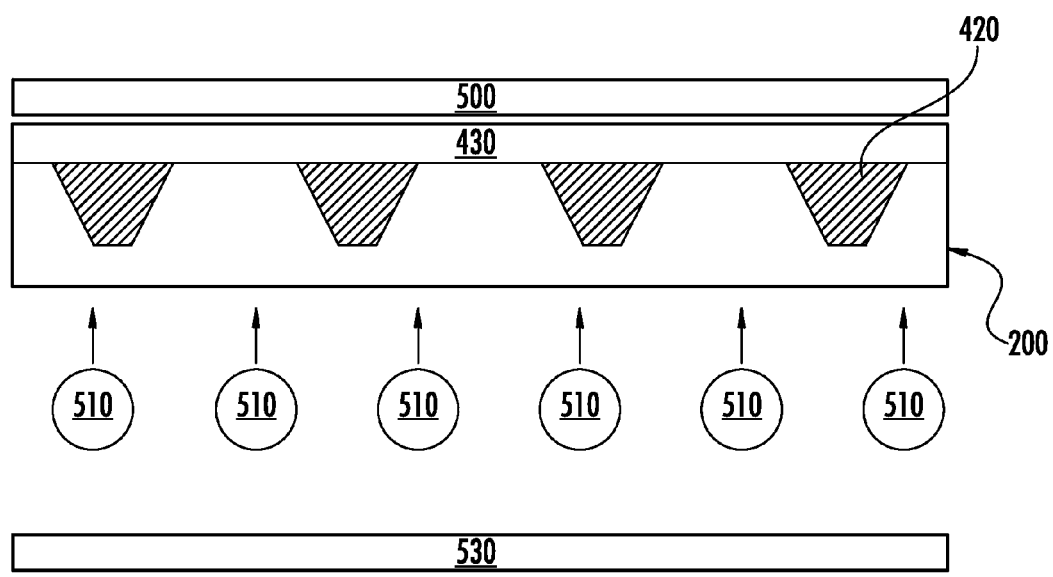
FIG. 5 shows a system using the chuck of FIG. 4.

FIG. 5 shows a system using the chuck 200 of FIG. 4. In this embodiment, one or more radiative heat sources 510 are disposed such that the chuck 200 is between the radiative heat sources 510 and the workpiece 500. In other words, the workpiece 500 is disposed on a first surface of the chuck 200 and the radiative heat sources 510 are disposed near the second surface of the chuck 200.

The radiative heat sources 510 are disposed so as to be directed toward the chuck 200. The radiative heat sources 510 may be heat lamps, which emit infrared light or other lamps emitting a frequency which can be used to heat the workpiece 500. The term "optically transparent" refers to the condition where radiation of the frequency emitted by the radiative heat sources 510 is able to substantially pass through the material used to construct the chuck 200.

Thus, if the radiative heat sources 510 emit infrared light, the chuck 200 would be transparent to this frequency range, but may not be transparent at other frequency ranges, such as visible light.

The radiative heat sources 510 emit radiative heat toward the second surface of the chuck 200. This energy passes through the chuck 200, exiting through the first surface of the chuck 200 and striking the underside of the workpiece 500, thereby heating the workpiece 500. Use of radiative heat sources, such as heat lamps, allows precise and rapid control of the temperature of the workpiece 500.

The radiative heat sources 510 may be disposed at regular intervals under the chuck 200. In this way, if each heat source 510 emits the same amount of heat, a nearly uniform pattern may be generated.

In some embodiments, the power applied to each of the radiative heat sources 510 is uniform. However, in other embodiments, the power applied to the different radiative heat sources 510 is specific to that heat source, based on its position under the workpiece 500. For example, if it is determined that more heat needs to be applied to the outer portion of the workpiece 500 to compensate for temperature non-uniformity, those radiative heat sources 510 located closest to the outer edge of the workpiece 500 may receive more power.

In some embodiments, a reflector plate 530 may be disposed such that the radiative heat sources 510 are located between the reflector plate 530 and the chuck 200.

This reflector plate 530 serves to reflect radiative heat from the radiative heat sources 510 back toward the chuck 200. The use of a reflector plate 530 may improve the efficiency of the radiative heat sources 510, such that more of the emitted heat reaches the workpiece 500. The reflector plate 530 may be made of any suitable material, including metallized quartz, fused quartz, fused silica or polished metal.

Figure 6:
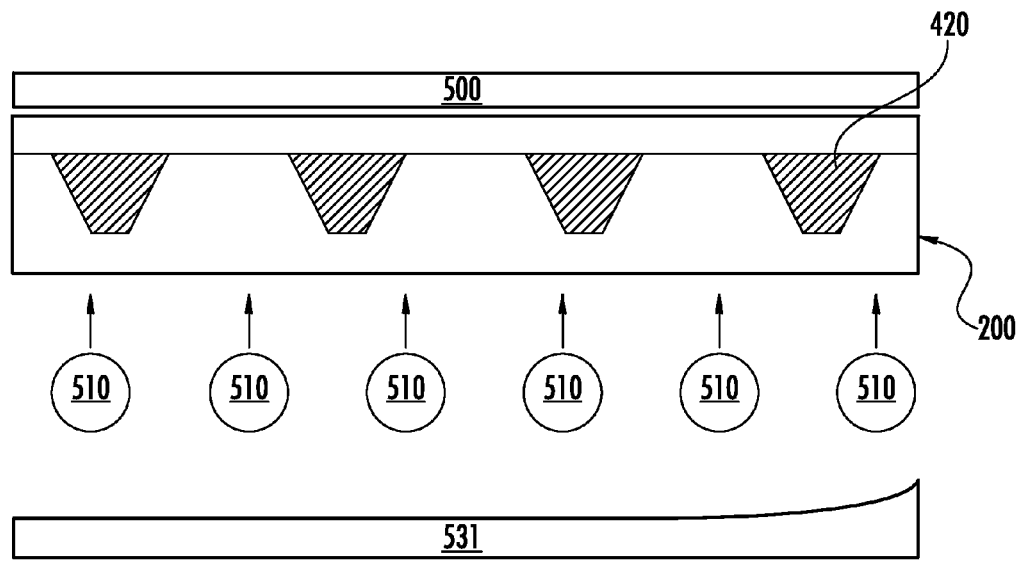
FIG. 6 shows a system according to a second embodiment.

The reflector plate 530 may also be used to focus the radiative heat toward specific portions of the underside of the workpiece 500. For example, in some embodiments, the outer portion of the workpiece 500 may be exposed less frequently to ions, and therefore may be slightly cooler than the center of the workpiece 500. In this case, the reflector plate 531 may be shaped so as to reflect more of the radiative heat toward the outer edge of the workpiece 500, as shown in FIG. 6, to compensate for the non-uniform heating caused by the ion implantation. Of course, the reflector plate 530 may be shaped differently to focus energy toward a different portion of the workpiece 500. For example, those skilled in the art will understand that the reflector plate 530 can be shaped to direct heat toward the center of the workpiece 500, or any other desired portion of the workpiece 500.

Figure 7:
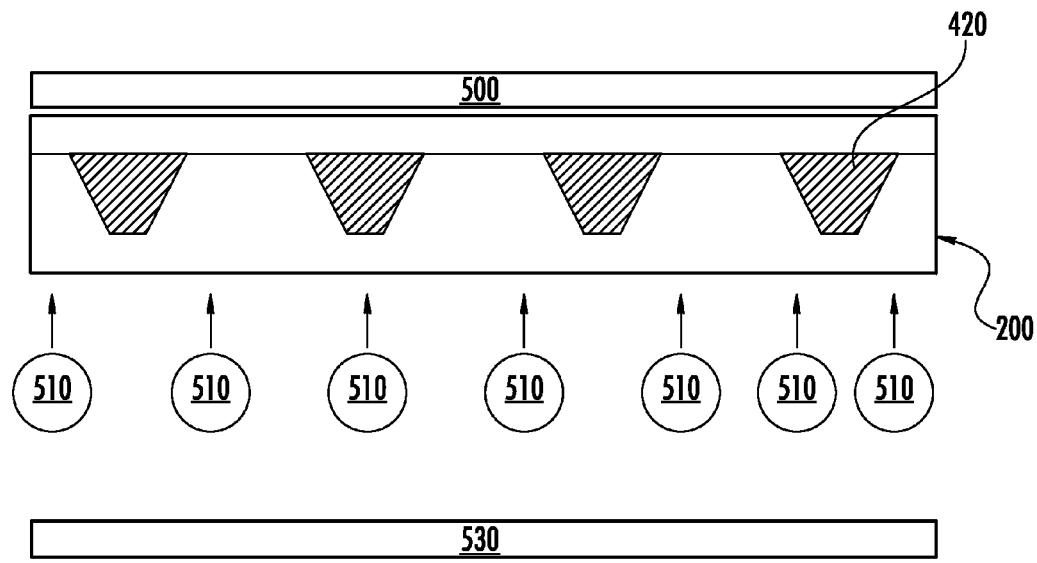
FIG. 7 shows a system having non-uniformly spaced radiative heat sources.

Other techniques may also be used to compensate for the non-uniform heating of the workpiece 500, caused by the ion implantation. For example, the radiative heat sources 510 may be disposed at irregular intervals. In the scenario described above, it may be beneficial to space the radiative heat sources 510 more closely together near the outer edge so that more radiative heat is emitted in this region, as shown in FIG. 7. Thus, the spacing of the radiative heat sources 510 may be used to compensate for non-uniform heating of the workpiece 500. FIG. 7 shows spacing consistent with applying more heat toward the outer edge of the workpiece 500. In other embodiments, the radiative heat sources 510 may be spaced differently to allow more heat to be directed toward any particular portion of the workpiece 500.

In another embodiment, the radiative heat sources 510 may be uniformly spaced. However, each may be configured to emit a specific amount of heat, based on the area of the workpiece 500 that it is proximate to. Thus, those radiative heat sources 510 nearest the outer edge of the workpiece 500 may emit more heat than those closer to the center of the workpiece 500.

In another embodiment, the electrically conductive pattern that is embedded in the chuck 200 may be modified to allow more radiative heat to reach particular portions of the workpiece 500. Referring to FIG. 3, it may be beneficial to dispose the radial components 220 of the electrically conductive pattern at irregular intervals. For example, the radial components 220 of the electrically conductive pattern may be less closely spaced near the outer edge of the chuck 200 to allow more radiative heat to pass through this portion of the chuck 200. In other embodiments, the radial components 220 near the center of the chuck may be spaced further apart, since the axial components 210 are more closely spaced in this region. In other words, the electrically conductive mesh pattern may be configured to allow certain portions of the mesh to be more transparent to the radiative heat than other portions.

Figure 8:
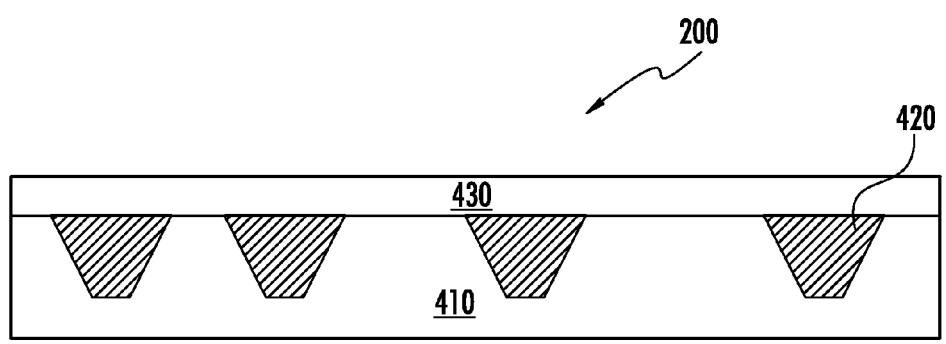
FIG. 8 shows a chuck according to another embodiment.

A cross sectional view of the chuck 200 having non-uniform channel spacing is shown in FIG. 8. This embodiment shows the radial components 220 spaced further apart near the outer edge of the workpiece 500. Other configurations are also possible.

In addition to modifying the spacing of the various components of the electrically conductive mesh pattern, the thickness of each component may be modified as well. For example, in some embodiments, the channels 420 (See FIG. 4) are sufficiently thin so that the electrically conductive material does not block a significant amount of radiative heat. In other embodiments, the thickness of the radial and axial components may vary. For example, the thickness of the individual radial components may be thinner toward the outer edge of the workpiece to allow more radiative heat to pass through this region.

In other embodiments, the electrically conductive material used to form the conductive pattern may be optically transparent. For example, a doped semiconductor, such as a transparent conductive oxide (TCO) film such as aluminum doped zinc oxide or tin-doped indium oxide, may be used. In this way, the electrically conductive pattern does not substantially affect the passage of radiative heat from the radiative heat sources 510 to the workpiece 500. In this embodiment, the conductive pattern may be a mesh as described above. However, in other embodiments, since the conductive material is optically transparent, the conductive pattern may be a solid region, which may be disposed on the top surface of the insulating layer 410.

In some embodiments, more than one of these techniques is employed. For example, the radiative heat sources 510 may be irregularly spaced, and the reflector plate 530 may be shaped to focus the light at one particular portion of the workpiece 500.

FIG. 9A-D shows the effects of the various approaches described herein. This embodiment assumes that more radiative heat is required near the outer edge of the workpiece. One skilled in the art recognizes that these approaches can be modified to tailor the heat distribution.

Figure 9:
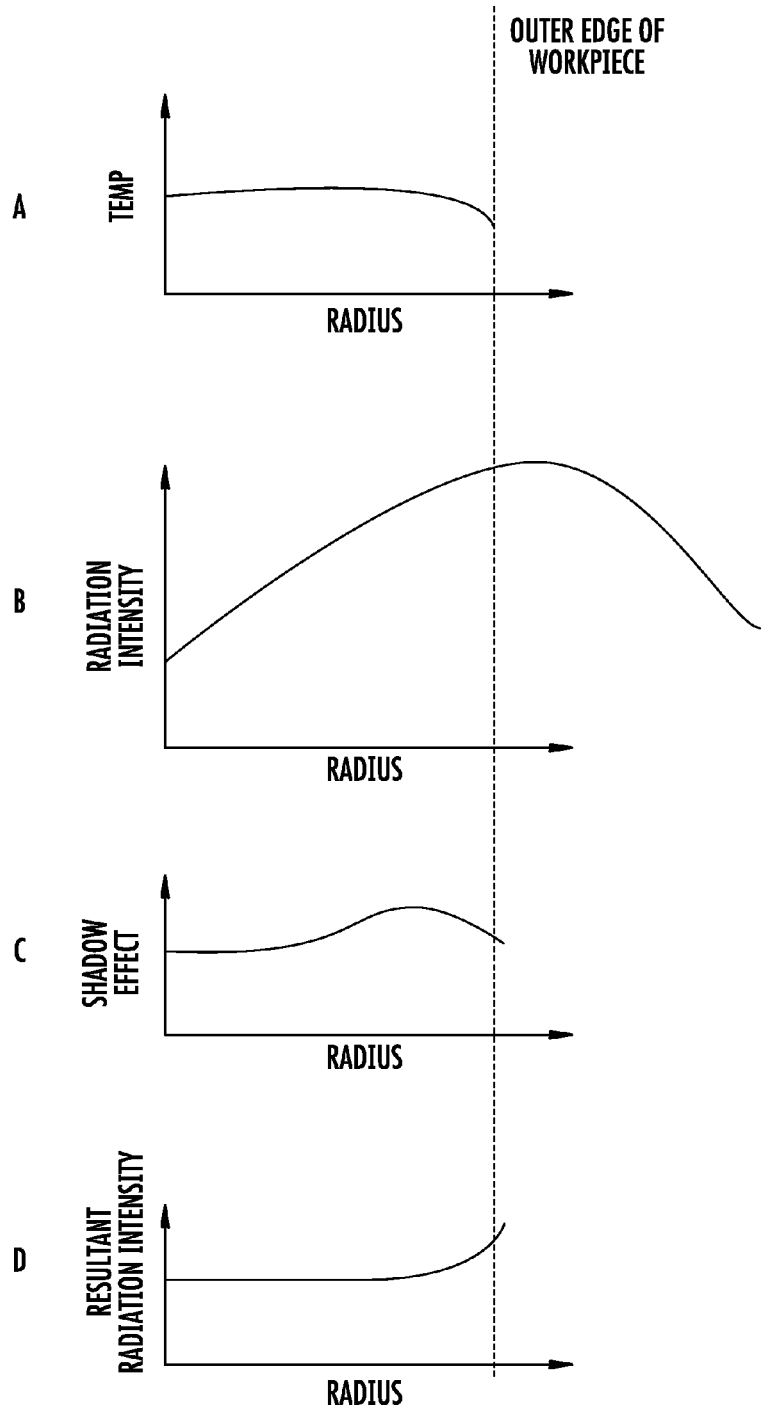
FIGS. 9A-D shows the effect of the various approaches used to heat the workpiece.

FIG. 9A shows the workpiece temperature profile due to the ion implantation, as a function of distance from the center of the workpiece. As is shown in the graph, the temperature of the workpiece decreases as the distance from the center of the workpiece increases. The remaining graphs show the effects of the various approaches described herein to compensate for this non-uniformity.

FIG. 9B shows the radiative heat intensity due to the spacing of the radiative heat sources 510, the power applied to the radiative heat sources 510, and the shape of the reflector plate 530. As more heat is required near the outer edge of the workpiece 500, a heat profile is created which supplies more heat toward this portion of the workpiece 500.

FIG. 9C shows the negative effects caused by shadowing due to the electrically conductive pattern. As described above, in some embodiments, the electrically conductive pattern may not be optically transparent, and therefore blocks some of the radiative heat.

FIG. 9D shows the resulting radiation intensity striking the workpiece 500. In other words, when the radiation intensity profile of FIG. 9B is passed through the shadow profile of FIG. 9C, the resulting radiative heat that strikes the workpiece 500 is shown in FIG. 9D.

The profile of FIG. 9D is intended to compensate for the inherent non-uniformity shown in FIG. 9A, so as to insure that the entire workpiece 500 is maintained at a constant temperature. Thus, when the radiative heating profile of FIG. 9D is applied to the workpiece 500 being implanted, the temperature of the workpiece 500 will remain constant throughout the implantation process.

In some embodiments, the present chuck 200 is used when implanting workpieces at an elevated temperature. In these embodiments, it may be beneficial to maintain the workpiece at an elevated temperature, so as to reduce the damage caused by the implant.

As described above, the ions being implanted tend to heat the workpiece to a certain temperature. This temperature may be less than that desired for the implant. Therefore, this heat is augmented or supplemented by the chuck 200, radiative heat sources 510 and reflector plate 530 described herein. The amount of radiative heat required may be based on the desired workpiece temperature and the heat generated by the ion implantation. The amount of required radiative heat may be determined empirically, such as by testing. For example, one or more workpieces is subjected to the desired ion implant process and the temperature of the workpiece during the implant is monitored. Based on the results of the test, the location of each radiative heating source 510, its power level, the shape of the reflector plate 530 and other parameters can be optimized for a specific implant process.

In another embodiment, the system may include a controller, which receives input regarding the temperature of the workpiece. Based on this, the power level of the radiative heat sources 510 can be adjusted. In some embodiments, the radiative heat sources 510 may be movable using a programmable actuator, such that the controller can move the radiative heat sources 510 based on the measured workpiece temperatures.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for holding and heating a workpiece, comprising:
   an electrostatic chuck, having a first surface for supporting said workpiece clamped to said first surface and a second surface opposite said first surface, comprising an insulating layer and a dielectric layer, and wherein an electrically conductive pattern is embedded in a surface of said insulating layer; and
   one or more radiative heat sources proximate said second surface of said electrostatic chuck, emitting radiative heat within a predetermined frequency range, wherein said electrostatic chuck is comprised of a material that is optically transparent to at least a portion of said predetermined frequency range,
   wherein said electrically conductive pattern is a mesh formed of channels, with an electrically conductive material disposed in said channels, said channels spaced apart to provide a sufficiently large open area for said radiative heat to pass through, wherein the channels occupy less than about 20% of an area of said surface of said insulating layer.

2. The system of claim 1, wherein the material is selected from the group consisting of quartz, glass and sapphire.

3. The system of claim 1, wherein said mesh comprises an axial component and a radial component and said radial component is unequally spaced, thereby allowing more radiative heat to be able to pass through a portion of said pattern.

4. The system of claim 1, wherein said electrically conductive pattern is formed of a material that is optically transparent to at least a portion of said predetermined frequency range.

5. The system of claim 4, wherein said material is selected from the group consisting of transparent conductive oxide (TCO) film and graphene.

6. The system of claim 1, further comprising a reflector plate such that said one or more radiative heat sources is disposed between said reflector plate and said electrostatic chuck.

7. The system of claim 6, wherein said reflector plate is shaped so as to focus said radiative heat at a portion of said workpiece.

8. The system of claim 1, wherein said radiative heat sources are unequally spaced so as to provide more radiative heat to a portion of said workpiece.

9. The system of claim 1, wherein said predetermined frequency range comprises infrared light.

10. An electrostatic chuck, comprising:
    an insulating layer comprising channels in its top surface;
    an electrically conductive material disposed in said channels, said electrically conductive material forming a mesh electrode; and a
    dielectric layer deposited on said insulating layer, wherein said insulating layer and said dielectric layer are optically transparent to a predetermined frequency range and wherein said channels are sufficiently thin and spaced apart so as occupy less than about 20% of an area of said surface of said insulating layer.

11. The electrostatic chuck of claim 10, wherein said insulating layer comprises a material selected from the group consisting of quartz, glass and sapphire.

12. The electrostatic chuck of claim 10, wherein said dielectric layer comprises glass.

13. The electrostatic chuck of claim 10, wherein said predetermined frequency range comprises infrared light.

14. The electrostatic chuck of claim 10, wherein said mesh electrode is arranged in a pattern, said pattern comprises an axial component and a radial component and said pattern is created such that said radial component is unequally spaced thereby allowing more light to be able to pass through a portion of said pattern.

15. The electrostatic chuck of claim 10, wherein said electrically conductive material is optically transparent to said frequency range.

16. The electrostatic chuck of claim 15, where said electrically conductive material is selected from the group consisting of a transparent conductive oxide (TCO) film and graphene.

\* \* \* \* \*